(12) United States Patent
Thorseth et al.

(10) Patent No.: US 10,988,852 B2
(45) Date of Patent: Apr. 27, 2021

(54) METHOD OF ELECTROPLATING COPPER INTO A VIA ON A SUBSTRATE FROM AN ACID COPPER ELECTROPLATING BATH

(71) Applicant: Rohm and Haas Electronic Materials LLC, Marlborough, MA (US)

(72) Inventors: Matthew Thorseth, Westminster, MA (US); Mark Scalisi, Salem, NH (US); Corey Ciullo, Brookline, MA (US)

(73) Assignee: Rohm and Haas Electronic Materials LLC, Ma, MA (US)

( * ) Notice: Subject to any disclaimer, the term of this patent is extended or adjusted under 35 U.S.C. 154(b) by 1197 days.

(21) Appl. No.: 14/923,763

(22) Filed: Oct. 27, 2015

(65) Prior Publication Data
US 2017/0114469 A1  Apr. 27, 2017

(51) Int. Cl.
| | |
|---|---|
| *C25D 3/38* | (2006.01) |
| *H01L 21/288* | (2006.01) |
| *H01L 21/768* | (2006.01) |
| *C25D 5/02* | (2006.01) |
| *C25D 7/12* | (2006.01) |

(52) U.S. Cl.
CPC ............... *C25D 3/38* (2013.01); *C25D 5/02* (2013.01); *C25D 7/123* (2013.01); *H01L 21/2885* (2013.01); *H01L 21/76879* (2013.01); *H01L 21/76898* (2013.01)

(58) Field of Classification Search
None
See application file for complete search history.

(56) References Cited

U.S. PATENT DOCUMENTS

| | | | |
|---|---|---|---|
| 3,770,598 A | 11/1973 | Creutz | |
| 3,778,357 A | 12/1973 | Dalms et al. | |
| 3,956,084 A | 5/1976 | Kardos et al. | |
| 4,038,161 A | 7/1977 | Eckles et al. | |
| 4,374,709 A | 2/1983 | Combs | |
| 4,376,685 A | 3/1983 | Watson | |
| 4,502,926 A * | 3/1985 | Barber, Jr. ............... | C25D 3/22 205/261 |
| 4,673,469 A | 6/1987 | Beach et al. | |
| 7,128,822 B2 | 10/2006 | Wang et al. | |
| 7,510,639 B2 | 3/2009 | Wang et al. | |
| 7,670,950 B2 | 3/2010 | Richardson et al. | |
| 8,454,815 B2 | 6/2013 | Niazimbetova et al. | |

(Continued)

FOREIGN PATENT DOCUMENTS

| | | |
|---|---|---|
| EP | 1371757 A1 | 12/2003 |
| JP | 2007332447 A | 12/2007 |

OTHER PUBLICATIONS

Gaymalov, Z.Z., et al., "The Effect of the Nonionic Block Copolymer Pluronic P85 on Gene Expression in Mouse Muscle and Antigen Presenting Cells", Biomaterials, 30, 6, 1232-1245. (Year: 2009).*

(Continued)

*Primary Examiner* — Stefanie S Wittenberg
(74) *Attorney, Agent, or Firm* — John J. Piskorski

(57) ABSTRACT

Copper electroplating baths containing primary alcohol alkoxylate block copolymers and ethylene oxide/propylene oxide random copolymers having specific HLB ranges are suitable for filling vias with copper, where such copper deposits are substantially void-free and substantially free of surface defects.

12 Claims, 3 Drawing Sheets

(56) References Cited

U.S. PATENT DOCUMENTS

| | | |
|---|---|---|
| 8,747,643 B2 | 6/2014 | Niazimbetova et al. |
| 2001/0047943 A1 | 12/2001 | Barstad et al. |
| 2004/0168928 A1 | 9/2004 | Vishwas |
| 2004/0217009 A1 | 11/2004 | Mikkola et al. |
| 2006/0213780 A1* | 9/2006 | Shih .................. C25D 3/38 205/296 |
| 2010/0084277 A1 | 4/2010 | Park et al. |
| 2010/0276292 A1 | 11/2010 | Webb et al. |
| 2013/0341199 A1 | 12/2013 | Uchida et al. |

OTHER PUBLICATIONS

Search report for corresponding Europe Application No. 16 19 3170 dated Mar. 14, 2017.
Search report for corresponding Taiwan Application No. 105133091 dated Mar. 13, 2017.
Davies, "Hydrophilic-lipophilic balance", Wikipedia, 1957.
J.T. Davis, "A quantitative kinetic theory of emulsion type. I. Physical chemistry of the emulsifying agent", Reprinted from : Gas/Liquid and Liquid/Liquid interfaces, Proceedings of 2nd International Congress Surface Activity, Butterworths, London 1657.
Search report for corresponding European Application No. 16 19 3170 dated May 24, 2017.
Search report for corresponding China Application No. 201610908320.6 dated Dec. 14, 2017.
Killge, et al, "Copper-Based TSV:Interposer", 3D Stacked Chips, Chapter 2, 2016, pp. 9-28.

\* cited by examiner

METHOD OF ELECTROPLATING COPPER INTO A VIA ON A SUBSTRATE FROM AN ACID COPPER ELECTROPLATING BATH

FIELD OF THE INVENTION

The present invention is directed to a method of electroplating copper into a via on a substrate from an acid copper electroplating bath. More specifically, the present invention is directed to a method of electroplating copper into a via on a substrate from an acid copper electroplating bath where the copper deposit has a substantially void free via fill and defect free surface.

BACKGROUND OF THE INVENTION

Copper is used extensively in the manufacture of electronic devices, including integrated circuit (IC) devices. For example, copper damascene processes used in the manufacture of integrated circuits involve the formation of inlaid copper wiring patterns with the simultaneous formation of via connections between metal layers. In such processes, the copper is deposited electrolytically. Various copper electroplating formulations have been developed to meet the unique needs of depositing copper in the very small sized features, such as ≤150 nm, used in damascene metallization processes in the manufacture of ICs. Such copper electroplating baths typically require an accelerator, leveler and suppressor as organic additives in order to get defect-free copper deposits.

Recent trends in the semiconductor industry to increase the density of IC devices have led to three-dimensional (3-D) packages and 3-D ICs, both of which make use of through-silicon vias (TSVs). A TSV is a vertical electrical connection passing through a wafer or die, and are typically formed from copper. Typically, TSVs have a depth of from 5 to 400 µm, a diameter of from 1 to 100 µm, and high aspect ratios, such as from 3:1 to 50:1. The dimensions of TSVs are challenging to fill with copper from a conventional electroplating bath in a reasonable amount of time such that the resulting copper deposit is void-free and free of surface defects. Voids in a TSV copper deposit can lead to circuitry failure. Surface defects require additional polishing to remove them to obtain a planar surface prior to subsequent processing.

Certain copper electroplating baths have been developed specifically to deposit copper in TSVs. For example, U.S. Pat. No. 7,670,950 discloses the void-free filling of TSVs with copper using a copper electroplating bath that does not contain a suppressor. However, this patent does not address the issue of surface defects in such copper deposits. Accordingly, there remains a need for copper electroplating baths that provide void-free deposits that are also free of surface defects.

SUMMARY OF THE INVENTION

A method of filling a via in an electronic device with copper comprising:

a) providing an acid copper electroplating bath comprising a source of copper ions, an acid electrolyte, a source of halide ions, an accelerator, a leveler, a primary alcohol alkoxylate diblock copolymer having a structure:

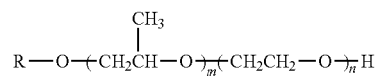

$$R-O-(CH_2CH(CH_3)-O)_m-(CH_2CH_2-O)_n-H \quad (I)$$

wherein R is a linear or branched ($C_1$-$C_{15}$) alkyl moiety or a linear or branched ($C_2$-$C_{15}$) alkenyl moiety and m and n can be the same or different and are moles of each moiety wherein the primary alcohol alkoxylate has a weight average molecular weight of 500 g/mole to 20,000 g/mole and a random or block alkoxylate copolymer including ethylene oxide and propylene oxide moieties, wherein the random or block alkoxylate copolymer has an HLB of 16 to 35, and the copper electroplating bath has a surface tension ≤40 mN/m;

b) providing as a cathode an electronic device substrate having one or more vias to be filled with copper and having a conductive surface;

c) contacting the electronic device substrate with the copper electroplating bath; and d) applying a potential for a period of time sufficient to fill the vias with a copper deposit; wherein the copper deposit in the vias is substantially void-free and substantially free of surface defects.

An acid copper electroplating bath composition comprising: a source of copper ions; an acid electrolyte; a source of halide ions; an accelerator; a leveler; a primary alcohol alkoxylate diblock copolymer having a structure:

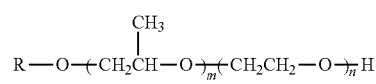

$$R-O-(CH_2CH(CH_3)-O)_m-(CH_2CH_2-O)_n-H \quad (I)$$

wherein R is a linear or branched ($C_1$-$C_{15}$) alkyl moiety or a linear or branched ($C_2$-$C_{15}$) alkenyl moiety and m and n can be the same or different and are moles of each moiety wherein the primary alcohol alkoxylate has a weight average molecular weight of 500 g/mole to 20,000 g/mole, and a random or block alkoxylate copolymer including ethylene oxide and propylene oxide moieties, wherein the random or block alkoxylate copolymer has an HLB of 16 to 35, and the copper electroplating bath has a surface tension ≤40 mN/m.

The acid copper electroplating methods and acid copper electroplating baths enable the formation of substantially void-free vias and bright copper deposits. The acid copper electroplating methods and acid copper electroplating baths are highly suitable for filling TSVs.

DETAILED DESCRIPTION OF THE INVENTION

Figure 1:
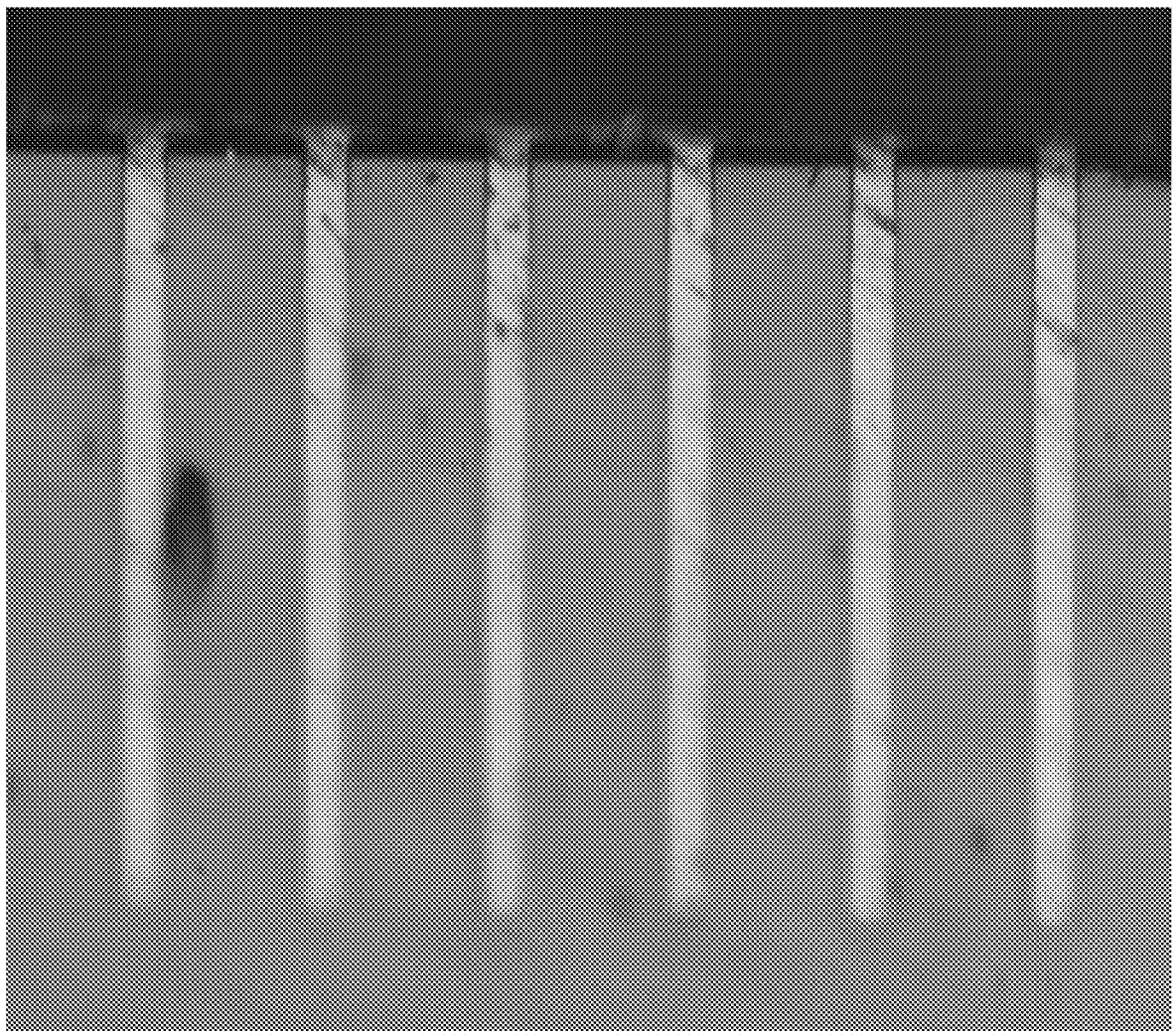
FIG. 1 is an optical micrograph at 60× showing a cross-section of copper filled TSVs plated with a copper electroplating bath having suppressors of the invention.

As used throughout this specification, the following abbreviations shall have the following meanings, unless the context clearly indicates otherwise: ° C.=degree Celsius; g=gram; mL=milliliter; ppm=parts per million=mg/L; L=liter; mN=millinewtons; m=meter; dm=decimeter; cm=centimeter; μm=micron=micrometer; nm=nanometer; Å=angstrom; min.=minute; A=ampere; mA=milliampere; EO=ethylene oxide=—CH$_2$—CH$_2$—O—; PO=propylene oxide=—CH$_2$—CH$_2$(CH$_3$)—O— or —CH(CH$_3$)—CH$_2$—O—; Mw=weight average molecular weight in g/mole; Mn=number average molecular weight; and HLB=hydrophile-lipophile balance. All amounts are percent by weight ("wt %") and all ratios are weight ratios, unless otherwise noted. All percentages by weight are based on the total weight of the composition, unless otherwise noted. All numerical ranges are inclusive and combinable in any order, except where it is clear that such numerical ranges are constrained to add up to 100%.

The articles "a," "an" and "the" refer to the singular and the plural, unless the context indicates otherwise. The term "moiety" means a part or a functional group of a molecule. The term "moiety" and "group" are used interchangeably throughout the specification. As used throughout this specification, the term "plating" refers to electroplating, unless the context clearly indicates otherwise. "Deposition" and "plating" are used interchangeably throughout this specification. "Defects" refer to surface defects of a copper deposit, such as protrusions, pits and swirl defects, as well as voids within the copper deposit. "Accelerator" (also known as "brightener") refers to an organic additive that increases the rate of copper deposition during electroplating. The term "suppressor" (also known as "carrier") refers to an organic additive that suppresses the rate of copper deposition during electroplating. "Leveler" refers to an organic additive that is capable of providing a substantially planar copper deposit. The terms "leveler" and "leveling agent" are used interchangeably throughout this application. The term "hydrophilic" means having a tendency to mix with, dissolve in or be wetted by water. The term "lipophilic" means having a tendency to mix with lipids, fats and non-polar solvents. The term "hydrophobic" means tending to repel or fail to mix with water. The term "halide" refers to fluoride, chloride, bromide and iodide.

Copper electroplating baths of the present invention include a combination of a primary alcohol alkoxylate diblock copolymer surfactant with a weight average molecular weight of 500 g/mole to 20,000 g/mole and a random or block alkoxylate polymer surfactant having an HLB of 16 to 35. These two surfactants function as suppressors in the acid copper electroplating baths. The primary alcohol alkoxylate block copolymer has a structure:

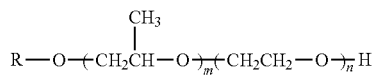
(I)

wherein R is a linear or branched (C$_1$-C$_{15}$) alkyl moiety or a linear or branched (C$_2$-C$_{15}$) alkenyl moiety and m and n are the same or different and are moles of each moiety wherein the primary alcohol alkoxylate diblock copolymer has a weight average molecular weight of 500 g/mole to 20,000 g/mole. Preferably, R is a linear or branched (C$_1$-C$_{15}$) alkyl moiety, more preferably R is a linear or branched (C$_5$-C$_{12}$)alky moiety. Preferably, the weight average molecular weight is from 500 g/mole to 15,000 g/mole, more preferably from 800 g/mole to 10,000 g/mole.

The primary alcohol alkoxylate diblock copolymers of the present invention can be prepared by various methods known in the literature. Typically the primary alcohol alkoxylate diblock copolymers are prepared by reacting ethylene oxide and propylene oxide block copolymers with primary alcohols. An example of commercially available primary alcohol alkoxylate diblock copolymer is ECOSURF™ EH-14 surfactant available from the Dow Chemical Company, Midland, Mich.

Random or block alkoxylate copolymers have a general formula:

$$R_1O—[(EO)_a(PO)_b]—R_2 \quad (II)$$

wherein the hydrophilic EO moieties are joined together and the hydrophobic PO moieties are joined together in blocks in the copolymer, such as a diblock or triblock arrangement or alternatively the hydrophilic EO moieties and the hydrophobic PO moieties are randomly dispersed throughout the copolymer, R$_1$ and R$_2$ can be the same or different and are chosen from hydrogen and linear or branched (C$_1$-C$_{15}$)alky moiety, and a and b can be the same or different and are moles of each moiety wherein the random or block alkoxylate copolymer has an HLB of 16 to 35. Preferably R$_1$ and R$_2$ can be the same or different and are chosen from hydrogen and linear or branched (C$_1$-C$_{15}$)alkyl. More preferably, R$_1$ and R$_2$ are hydrogen. Preferably the HLB is from 17 to 25, more preferably the HLB is from 18 to 25.

Preferably, the alkoxylate copolymers are triblock copolymers having the following structure:

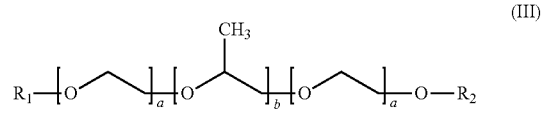
(III)

wherein R$_1$ and R$_2$ are as defined above and a and b can be the same or different and are moles of each moiety such that the HLB of the triblock copolymer is from 16 to 35, preferably from 17 to 25, more preferably from 18 to 25.

More preferably, the alkoxylate copolymers are triblock copolymers having the following structure:

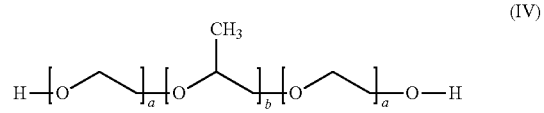
(IV)

wherein a and b are defined as above such that the HLB is from 16 to 35, preferably from 17 to 25, more preferably from 18 to 25.

The triblock copolymer can be prepared by methods known in the art and literature. Examples of commercially available EO/PO/EO triblock copolymers are PLURONIC™ P84 surfactant and PLURONIC™ P85 surfactant available from BASF.

HLB values for the random or block alkoxylate copolymers are calculated by the Davies' method using the following equation:

$$HLB = 7 + \sum_{i=1}^{m} H_i - n \times 0.475 \qquad \text{(Eq. 1)}$$

wherein here the variable m is the number of hydrophilic groups in the molecule, $H_i$ is the value of the $i^{th}$ hydrophilic groups and n is the number of lipophilic groups in the molecule. The PO groups of the triblock polymer and the —$CH_2$— groups or alkyl moieties are lipophilic while the EO groups and hydroxyl groups are hydrophilic. The number of hydrophilic groups and lipophilic groups of the random and block copolymers can vary as long as the HLB of the copolymer as based on the Davies method ranges from 16 to 35. Preferably, the EO groups range from 40% to 50% in the random or block alkoxylate copolymer.

The combination of an alkoxylate diblock copolymer as represented by formula (I) above and a random or block alkoxylate copolymer having an HLB of 16-35 allows for the electroplating of substantially defect and void free copper deposits for TSVs.

The Mw or the random and block alkoxylate copolymers having an HLB of 16 to 35 typically ranges from 2000 g/mole or greater, typically from 2000 g/mole to 10,000 g/mole. The Mw of the triblock copolymers ranges from 2000 g/mole to 10,000 g/mole, preferably from 3000 g/mole to 8000 g/mole, more preferably from 4000 g/mole to 5000 g/mole.

Typical sources of copper ions useful in the present electroplating baths are any copper compounds that are soluble in the electroplating bath. Suitable sources of copper ions include, but are not limited to, copper salts such as copper sulfate, copper persulfate, copper halide, copper chlorate, copper perchlorate, copper alkanesulfonates, copper alkanol sulfonate, copper arylsulfonates, copper fluoroborate, cupric nitrate, copper acetate, and copper citrate. Exemplary copper alkanesulfonates include copper methanesulfonate, copper ethanesulfonate, and copper propanesulfonate. Exemplary copper arylsulfonates include copper benzenesulfonate, copper toluenesulfonate, and copper phenolsulfonate. Copper sulfate, copper alkanesulfonates and copper arylsulfonates are preferred, and copper sulfate is most preferred. Mixtures of copper compounds may be used. Such sources of copper ions are generally commercially available and may be used without further purification. The source of copper ions may be used in the present electroplating baths in a relatively wide concentration range. Typically, the copper ion source is present in an amount sufficient to provide an amount of copper ion in the range of 10 to 80 g/L in the plating bath, preferably from 20 to 80 g/L, and more preferably from 25 to 75 g/L.

Any acid which is compatible with the source of copper ions and the other components may be suitably used as the electrolyte in the present electroplating baths. Suitable acids include, but are not limited to: sulfuric acid; acetic acid; fluoroboric acid; nitric acid; sulfamic acid; phosphoric acid; hydrogen halide acids such as hydrochloric acid; alkanesulfonic acids such as methane sulfonic acid, ethanesulfonic acid and propanesulfonic acid; arylsulfonic acids such as toluenesulfonic acid, phenolsulfonic acid and benzenesulfonic acid; and halogenated acids such as trifluoromethylsulfonic acid and haloacetic acid. Preferably, the acid is sulfuric acid, alkanesulfonic acid or arylsulfonic acid, and more preferably is sulfuric acid. Mixtures of acids may be used. Suitable acids are generally commercially available and may be used without further purification. The acid is used in the present compositions in an amount sufficient to impart conductivity to the electroplating bath. The total amount of acid electrolyte used in the present electroplating baths is typically from 0.01 to 75 g/L, preferably from 0.1 to 75 g/L, and more preferably from 1 to 70 g/L. It will be appreciated that higher amounts of acid may be used for certain applications. It will be further appreciated by those skilled in the art that by using copper sulfate, a copper alkanesulfonate or a copper arylsulfonate as the copper ion source, an acidic electrolyte can be obtained without any separately added acid.

The present copper electroplating baths are acidic, having a pH of <7. Preferably, the electroplating baths of the invention have a pH of ≤2, more preferably <2, and even more preferably ≤1.

Any suitable halide ions may be used in the present electroplating baths. Chloride and bromide are preferred halide ions, with chloride being more preferred. Mixtures of halide ions may be used, such as a mixture of chloride and bromide ions. A wide range of halide ion concentrations may be utilized, such as from 0.1 to 125 ppm of halide ion in the plating bath, preferably from 25 to 125 ppm, and more preferably from 40 to 100 ppm. Such halides may be added as the corresponding hydrogen halide acid or as any suitable salt that is soluble in the electroplating bath.

A wide variety of accelerators may be employed in the present copper electroplating baths. Preferably, the accelerator is a disulfide-containing compound. Suitable disulfide-containing accelerators have a molecular weight of 5000 or less and preferably 1000 or less. Disulfide-containing accelerators that also have sulfonic acid groups are more preferred, such as those having the formula:

$$R_3\text{—}S\text{—}S\text{—}R_4\text{—}SO_3X \qquad \text{(V)}$$

wherein $R_4$ is an optionally substituted alkyl, optionally substituted heteroalkyl, or optionally substituted aryl group; X is hydrogen or a counter ion such as sodium or potassium; and $R_3$ is hydrogen or an organic residue such as a group of the formula:

$$\text{—}R_4\text{—}SO_3X \qquad \text{(VI)}$$

wherein preferably $R_4$ is alkyl, more preferably $C_{1-16}$ alkyl, and most preferably unsubstituted $C_{1-8}$ alkyl. Heteroalkyl groups have one or more hetero (N, O or S) atoms in the alkyl chain, and have from 1 to 16 carbons, and preferably from 1 to 8 carbons. The aryl groups are preferably carbocyclic, such as phenyl or naphthyl. Heteroaromatic groups contain 1 to 3 of one or more of N, O and S atoms and 1 to 3 separate or fused rings and include, for example, coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, and benzothiazol. Heteroalkyl groups include heteroalicyclic groups such as groups that have 1 to 3 of one or more of N, O and S atoms and from 1 to 3 separate or fused rings. Substituents of substituted alkyl, heteroalkyl, and aryl groups include, for example, $C_{1-8}$ alkoxy, $C_{1-8}$ alkyl, halogen such as F, Cl and Br; cyano; and nitro. One or more accelerators may be used in the present compositions, and preferably one accelerator is used. Suitable disulfide-containing accelerators are generally commercially available, such as from Raschig, and may be used without further purification. Preferred disulfide-containing accelerators are those having the formula:

$$XO_3S—R_4—S—S—R_4—SO_3X \qquad (VII)$$

or $$XO_3S—Ar—S—S—Ar—SO_3X \qquad (VIII)$$

wherein $R_4$ is an optionally substituted $C_{1-6}$ alkyl; Ar is an optionally substituted aryl group; and X is hydrogen or a suitable counter ion. Preferably, $R_4$ is an optionally substituted $C_{1-4}$ alkyl, and more preferably a $C_{1-4}$ alkyl. It is preferred that Ar is selected from optionally substituted phenyl and optionally substituted naphthyl, and more preferably from phenyl and naphthyl. Preferred counter ions for X are sodium and potassium. Suitable preferred disulfide-containing accelerators are bis-sulfopropyl disulfide and bis-sodium-sulfopropyl disulfide.

Optionally, an additional accelerator that does not contain a disulfide group may be used in combination with the present disulfide-containing accelerator. Typical additional accelerators contain one or more sulfur atoms and may be, without limitation, thiols, mercaptans, sulfides, and organic sulfonic acids. For example, such additional accelerator compound may have the formula:

$$XO_3S—R''—SH \qquad (IX)$$

wherein R'' is an optionally substituted $C_{1-6}$ alkyl group, and preferably an unsubstituted $C_{1-4}$ alkyl; and X is hydrogen or a suitable counter ion such as sodium or potassium. Exemplary additional accelerators are well-known in the art and include, without limitation, N,N-dimethyl-dithiocarbamic acid (3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); 3-(benzthiazolyl-s-thio)propyl sulfonic acid (sodium salt); pyridinium propyl sulfobetaine; 1-sodium-3-mercaptopropane-1-sulfonate; and combinations of the above. Suitable additional accelerators are also described in U.S. Pat. Nos. 3,770,598; 3,778,357; 4,374,709; 4,376,685; 4,555,315; and 4,673,469. Such additional accelerators may be used alone or as a mixture of two or more. It is preferred that the present compositions are free of such additional accelerators.

The amount of the disulfide-containing accelerator present in a freshly prepared copper electroplating bath of the invention is from 0.05 to 500 ppm. Preferably, the disulfide-containing accelerator compound is present in an amount of from 0.1 to 250 ppm, more preferably from 0.5 to 100 ppm, yet more preferably from 0.5 to 50 ppm, and even more preferably from 0.5 to 25 ppm. Any additional accelerators present in the copper electroplating baths of the invention are used the amounts described for the disulfide-containing accelerators.

A wide variety of levelers is known in the art and may suitably be used in the present copper electroplating compositions. Levelers are typically used in the present electroplating compositions in an amount of 0.5 to 500 ppm, preferably from 0.5 to 100 ppm, and more preferably from 0.5 to 50 ppm. Preferably, the leveler is a nitrogen-containing compound. Exemplary levelers include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; reaction products of amines with epoxide-containing compounds; among others known in the art. Such reaction products are generally commercially available, such as from Raschig, or may be prepared by methods known in the art. Such leveler compounds may be used with or without further purification. Preferred levelers are reaction products of an amine with an epoxide compound such as epihalohydrin, glycidyl ethers, alkane dioxides, cycloalkane dioxides, or other suitable epoxide-containing compounds. Suitable amines include, but are not limited to, primary, secondary or tertiary amines, heterocyclic amines, heteroaromatic amines, and the like. Exemplary amines include, without limitation, dialkylamines, trialkylamines, arylalylamines, diarylamines, imidazole, triazole, tetrazole, benzimidazole, benzotriazole, piperidine, morpholine, piperazine, pyridine, pyrazine, oxazole, benzoxazole, pyrimidine, quinoline, and isoquinoline. Preferably, the amine is a heterocyclic or heteroaromatic, and more preferably heteroaromatic. Imidazole, benzimidazole, pyridine, and pyrazine are preferred amines. Suitable amines may be substituted or unsubstituted. By "substituted", it is meant that one or more of the hydrogens on the amine are replaced by one or more substituent groups, such as alkyl, aryl, alkoxy, halo, and alkenyl. Preferred epoxide compounds are epichlorohydrin, diglycidyl ethers of $C_{1-16}$ alkanes or cycloalkanes, and diepoxide-containing $C_{1-16}$ alkanes or cycloalkanes. Particularly preferred levelers are reaction products of one or more of imidazole, benzimidazole, pyridine, and pyrazine, each of which may be substituted or unsubstituted, with one or more epoxide-containing compound selected from epichlorohydrin, diglycidyl ethers of $C_{1-16}$ alkanes or cycloalkanes, and diepoxide-containing $C_{1-16}$ alkanes or cycloalkanes. Suitable reaction products of amines with epoxide compounds are those disclosed in U.S. Pat. Nos. 4,038,161; 6,610,192; 8,262,895; 8,268,157; 8,268,158; 8,454,815; and 8,747,643. The reaction products of amines with epoxide compounds disclosed in U.S. Pat. Nos. 8,262,895; 8,268,157; 8,268,158; 8,454,815; and 8,747,643 are preferred. Reaction products of one or more amines with one or more epoxide compounds may be used as levelers in the present compositions.

The suppressors may be used in the present composition provided that such suppressors provide a copper electroplating bath having a dynamic surface tension of ≤40 mN/m, as measured using a Krüss BP100 bubble tensiometer at a solution temperature of 25° C. and at a surface age of 30 sec. The dynamic surface tension of the copper electroplating baths is ≤40 mN/m and preferably <40 mN/m. There is no particular lower limit to the dynamic surface tension, but a preferred surface tension is in a range of 1 to 40 mN/m, more preferably from 10 to 40 mN/m and still more preferably from 25 to 39 mN/m. While not being bound by theory, the primary alcohol alkoxylate provides most of the reduction in surface tension, thus removing large surface swell defects. The random or block alkoxylate polymer provides improved interactions between the surface tension reduction agent and the other bath additives to give a bright surface.

The suppressors may be added to the present electroplating compositions in any amount that provides a copper electroplating bath that: has a dynamic surface tension of ≤40 mN/m, as measured using a Krüss bubble pressure tensiometer at 25° C.; remains clear (that is, does not turn cloudy) at a temperature of 30° C. for 2 days; deposits copper in a TSV where the copper deposit is substantially void-free, preferably void-free, and substantially free of surface defects, and more preferably void-free and surface defect-free. As used herein, "substantially void-free" means having no voids ≥0.1 μm dimension before annealing. "Substantially free of surface defects" means having no surface defects >2 μm in any dimension. Preferably, the total amount of suppressors in the copper plating baths is in amounts of 0.1 mg/L to 1000 mg/L. Preferably, the primary alcohol alkoxylate block copolymer are in amounts of 100 mg/L or greater, more preferably in amounts of 120 mg/L to 150 mg/L. Preferably, the random or block alkoxylate polymers are added in amounts of 40 mg/L to 250 mg/L.

While not preferred, the copper plating baths of the invention may also contain amounts of other alloying elements, such as, but not limited to, tin, zinc, indium, antimony, and the like. Such alloying elements are added to the electroplating baths in the form of any suitable bath-solution salt. Thus, the copper electroplating baths useful in the present invention may deposit copper or copper alloy. Preferably, the copper plating baths of the invention are substantially free of alloying metals, and more preferably free of alloying metals. By "substantially free" is meant that the plating baths contain less than 0.01 ppm of such alloying metals.

The present electroplating baths may be prepared by combining the source of copper ions, acid electrolyte, accelerator, leveler, suppressor, and any optional components in any order. The present copper electroplating baths also contain water. The water may be present in a wide range of amounts. Any type of water may be used, such as distilled, deionized (DI) or tap.

Vias, such as TSVs, in an electronic device substrate can be filled with copper according to the steps of: providing an acidic copper electroplating bath comprising a source of copper ions, an acid electrolyte, a source of halide ions, an accelerator, a leveler, and a suppressor, wherein the copper electroplating bath has a dynamic surface tension of ≤40 mN/m; providing as a cathode an electronic device substrate having one or more vias to be filled with copper and having a conductive surface; contacting the electronic device substrate with the copper electroplating bath; and applying a potential for a period of time sufficient to fill the vias with a copper deposit; wherein the copper deposit in the vias is substantially void-free and substantially free of surface defects.

A wide variety of electronic device substrates may be plated with copper according to the present invention, particularly electronic device substrates useful in 3-D integrated circuits and 3-D packages. Suitable electronic device substrates include those useful in RF devices, MEMs devices CMOS devices, memory devices including flash, DRAM and SRAM, logic devices, and anywhere else a 3-D stack is used. Such substrates are typically wafers or dies having one or more TSVs which, after subsequent, pass completely through a wafer or die. Typically, TSVs have a depth of from 5 to 600 μm, a diameter of from 1 to 200 μm, and high aspect ratios, such as from 3:1 to 20:1, although TSVs may have other suitable dimensions. Aspect ratio is defined as the ratio of the depth of the TSV to the diameter of the TSV at the via opening. The particular size and aspect ratio of a TSV depends on which stage in the overall 3-D process includes the TSV.

TSVs are formed in an electronic device substrate, such as a wafer, using techniques well-known in the art. The TSVs extend from a front surface of the substrate to a back surface of the substrate. The height of the TSV is determined by the thickness of the substrate. The surface of the substrate having active devices thereon is typically referred to as the front surface. As the substrate is non-conductive, the sidewalls of the TSV must be made conductive in order to electrodeposit copper in the via. First, a copper diffusion barrier, such as tantalum, tantalum nitride, tungsten, titanium, titanium nitride, ruthenium, or tungsten titanium, is deposited on the walls of the via, such as by chemical vapor deposition (CVD), atomic layer deposition (ALD), or physical vapor deposition (PVD). Next, a conductive seed layer is deposited on the barrier layer to provide a uniform conductive surface for electroplating. The conductive seed layer may be deposited by CVD, ALD, or PVD techniques.

The electronic device substrate having TSVs are then contacted with the present copper electroplating bath. The electronic device substrate, that is the wafer or die, functions as a cathode. Potential is applied to deposit copper into the TSV and onto the surface of the substrate. Any suitable potential may be used, including pulse current, direct current, reverse periodic current, periodic pulse reverse current, step current or other suitable current, with direct current being preferred. The present electroplating baths may be used at any temperature from 10 to 65° C. or higher. It is preferred that the temperature of the plating baths is from 10 to 35° C. and more preferably from 15 to 30° C. Typically, the present electroplating baths are agitated during use. Any suitable agitation method may be used with the present invention and such methods are well-known in the art. Suitable agitation methods include, but are not limited to, air sparging, work piece agitation, impingement, rotation and the like. When copper plating baths of the invention are used to plate TSVs in an electronic device substrate, such as wafer used in the manufacture of integrated circuits, the wafer may be rotated such as from 1 to 150 RPM. The electroplating bath of the invention contacts the rotating wafer, such as by pumping or spraying the bath onto the wafer. In the alternative, the wafer need not be rotated where the flow of the plating bath is sufficient to provide the desired metal deposit. Sufficient potential is applied for a period of time sufficient to fill the TSVs with copper, where the copper deposit in the TSVs is substantially void-free, and where the surface of the copper deposit is substantially free of surface defects. Suitable current density is in the range of from 0.1 to 50 mA/cm$^2$, and preferably from 0.4 to 6 mA/cm$^2$. Suitable plating times vary from 5 to 120 min., although such times depend on the particular TSV feature sizes. It will be appreciated by those skilled in the art that a first, relatively low current density may be used for a first period to initiate copper plating, followed by increasing the current density for a subsequent period. The current density may be increased continuously, or in a step-wise manner, in which two or more steps may be used. The optimal current density and duration are generally determined experimentally and may vary depending upon the aspect ratio and dimension of the TSV. Following copper plating, the plated substrate may optionally be rinsed, dried, and planarized before being subjected to subsequent processing steps.

The present copper electroplating baths provide superfilling, which is bottom-up-growth, of TSVs. In superfilling, copper is preferentially deposited in the bottom of a via, such as a TSV. Such bottom-up filling is critical to providing a substantially void-free, and preferably void-free, copper deposit in the via. The leveler and suppressor in the copper electroplating bath are used to slow the plating rate down at the surface of the substrate, while the accelerator enhances the plating rate at the bottom of the via. Balancing both the selection of and the amount of accelerator, suppressor, and leveler allows void-free via filling. It has been surprisingly found that the present suppressors, which provide a copper electroplating bath having a dynamic surface tension of ≤40 mN/m not only work to provide superfilling of TSVs, but also significantly reduce surface defects, such as swirl defects, on the resulting deposit and provide a bright surface.

Example 1

Copper electroplating baths were prepared by first combining 60 g/L Cu$^{2+}$ from CuSO$_4$.5H$_2$O, 60 g/L H$_2$SO$_4$, and 50 mg/L Cl⁻ from 1N HCl, and then adding 6 mg/L of the accelerator sodium bis(sulfopropyl)disulfide from stock solution, 17.5 mg/L of a leveler which was a reaction product of butyl diglycidyl ether, 75% 4-phenyl imidazole and 25% imidazole from a stock solution. Each bath included Suppressors 1 and 2 in amounts shown in Table 1 below.

TABLE 1

| Suppressor No | Suppressor Material | Amount | Trade Name |
|---|---|---|---|
| 1 | R—O—(PO)$_m$—(EO)$_n$—H diblock copolymer Mw = 1037 g/mole | 120 mg/L | ECOSURF ™ EH 14 surfactant |
| 2 | HO—(EO)$_a$—(PO)$_b$—(EO)$_a$H triblock copolymer, Mw = 4200 g/mole | 100 mg/L | PLURONIC ™ P84 surfactant |

R is a branched 2-ethylhexane moiety. The HLB of the triblock copolymer was determined to be 19 using the Davies method. Variables used for calculating the HLB by the Davies method are in the table below:

TABLE 2

| % EO | Mw EO | Mw PO | # EO Groups | # PO Groups | # CH Groups | # Ether Groups | # OH Groups |
|---|---|---|---|---|---|---|---|
| 40 | 1680 | 2520 | 38 | 43 | 205 | 81 | 2 |

Example 2

Via fill testing was performed on various test wafer coupons having 5 μm diameter×55 μm deep TSVs. The coupons were attached to the plating head of a segment plater with conductive copper tape, which was then covered by platers tape from 3M, Minneapolis, Minn. All coupons were subjected to a 5 minute deionized water spray prior to plating. Each wafer coupon acted as the cathode and was rotated by a Pine Instruments MSRX rotator at 50 rpm and was contacted with the electroplating baths from Example 1. The temperature of the electroplating bath was 25° C. The plating waveform used to monitor surface (swirl) defects is reported in Table 3, where CD is the current density. The dynamic surface tension of each of the plating baths was measured at 25° C. using a Krüss BP100 bubble pressure tensiometer at a surface age of 30 seconds and was determined to be 36.7 mN/m.

TABLE 3

| | Cu Deposit thickness, Å | CD, mA/cm² | Time, min. |
|---|---|---|---|
| Hot entry | 0 | 0.1 | 0 |
| Step 1 | 1500 | 1 | 6.76 |
| Step 2 | 2000 | 2 | 4.50 |
| Step 3 | 2500 | 3 | 3.75 |
| Step 4 | 4000 | 5 | 3.60 |
| Total: | 10,000 | | 18.62 |

Following copper plating to fill the TSVs, the wafer coupons were cross-sectioned and imaged by optical microscopy at a 60× magnification. The optical images were evaluated to determine the filling ability of the plating bath. All of the TSVs appeared to be filled with copper. No voids were observed. FIG. 1 is an optical micrograph of one of the samples examined for voids. FIG. 1 shows no voids in the TSVs. In addition, all surfaces of the samples appeared bright. There were no observable defects or swirls on the copper surface.

Example 3

The method disclosed in Example 2 was repeated except that the suppressor combination had the components in Table 4.

TABLE 4

| Suppressor No | Suppressor Material | Amount | Trade Name |
|---|---|---|---|
| 1 | R—O—(PO)$_m$—(EO)$_n$—H diblock copolymer Mw = 1037 g/mole | 120 mg/L | ECOSURF ™ EH 14 surfactant |
| 2 | HO—(EO)$_a$—(PO)$_b$—(EO)$_a$—OH triblock triblock copolymer, Mw = 4600 g/mole | 100 mg/L | PLURONIC ™ P85 surfactant |

R is as defined in Example 1 above. The HLB for the triblock copolymer was determined to be 24 using the Davies method. Variables used for calculating the HLB are in the table below:

TABLE 5

| % EO | Mw EO | Mw PO | # EO Groups | # PO Groups | # CH Groups | # Ether Groups | # OH Groups |
|---|---|---|---|---|---|---|---|
| 50 | 2300 | 2300 | 52 | 40 | 224 | 92 | 2 |

After the TSVs were filled they were analyzed by the same method described in Example 2. No voids were observed in the samples. The cross-sections of the samples appeared substantially the same as shown in FIG. 1. All the samples had bright copper surfaces. There were no observable defects on the copper deposits.

Example 4 (Comparative)

The method disclosed in Example 2 was repeated except that the suppressor combination had the components in Table 6.

TABLE 6

| Suppressor No | Suppressor Material | Amount | Trade Name |
|---|---|---|---|
| 1 | R—O—(PO)$_m$—(EO)$_n$—H diblock copolymer Mw = 1037 g/mole | 120 mg/L | ECOSURF ™ EH 14 surfactant |
| 2 | H—(EO)$_a$—(PO)$_b$—(EO)$_a$—OH triblock copolymer, Mw = 5750 g/mole | 100 mg/L | PLURONIC ™ P123 surfactant |

R is defined in Example 1 above. The HLB was determined to be 15.8. Variables used for calculating the HLB are in the table below:

TABLE 7

| % EO | Mw EO | Mw PO | # EO Groups | # PO Groups | # CH Groups | # Ether Groups | # OH Groups |
|---|---|---|---|---|---|---|---|
| 30 | 1725 | 4025 | 39 | 69 | 285 | 108 | 2 |

After the TSVs were filled they were analyzed by the same method as described in Example 2. No voids were observed in the samples. However, the copper deposits showed some defects along the edges.

Example 5 (Comparative)

Copper electroplating baths were prepared by first combining 60 g/L $Cu^{2+}$ from $CuSO_4.5H_2O$, 60 g/L $H_2SO_4$, and 50 mg/L $Cl^-$ from 1N HCl, and then adding 6 mg/L of the accelerator sodium bis(sulfopropyl)disulfide from stock solution, 15.5 mg/L of a leveler which was a reaction product of butyl-diglycidyl ether, 75% 4-phenyl imidazole and 25% imidazole from a stock solution. Each bath included the suppressors shown in table 8.

TABLE 8

| Suppressor No | Suppressor Material | Amount | Trade Name |
|---|---|---|---|
| 1 | R—O—$(PO)_m$—$(EO)_n$—H diblock copolymer Mw = 1037 g/mole | 120 mg/L | ECOSURF ™ EH 14 surfactant |
| 2 | HO—$(EO)_a$—$(PO)_b$—$(EO)_a$—H triblock polymer, Mw = 4700 g/mole | 100 mg/L | PLURONIC ™ F38 surfactant | where R is defined above in Example 1. The HLB was determined to be 38.6. Variables used for calculating the HLB are in the table below:

TABLE 9

| % EO | Mw EO | Mw PO | # EO Groups | # PO Groups | # CH Groups | # Ether Groups | # OH Groups |
|---|---|---|---|---|---|---|---|
| 80 | 3760 | 940 | 85 | 16 | 218 | 101 | 2 |

Via fill testing was performed on various test wafer coupons having 5 μm diameter×55 μm deep TSVs. The coupons were attached to the plating head of a segment plater with conductive copper tape, which was then covered by platers tape from 3M, Minneapolis, Minn. All coupons were subjected to a 5 minute deionized water spray prior to plating. Each wafer coupon acted as the cathode and was rotated by a Pine Instruments MSRX rotator at 50 rpm and was contacted with the electroplating baths described above. The temperature of the electroplating bath was 25° C. The plating waveform used to monitor surface (swirl) defects is reported in Table 3 in Example 2, where CD is the current density. The dynamic surface tension of each of the plating baths was measured at 25° C. using a Krüss BP100 bubble pressure tensiometer at a surface age of 30 seconds and was found to be 36.7 mN/m.

Figure 2:
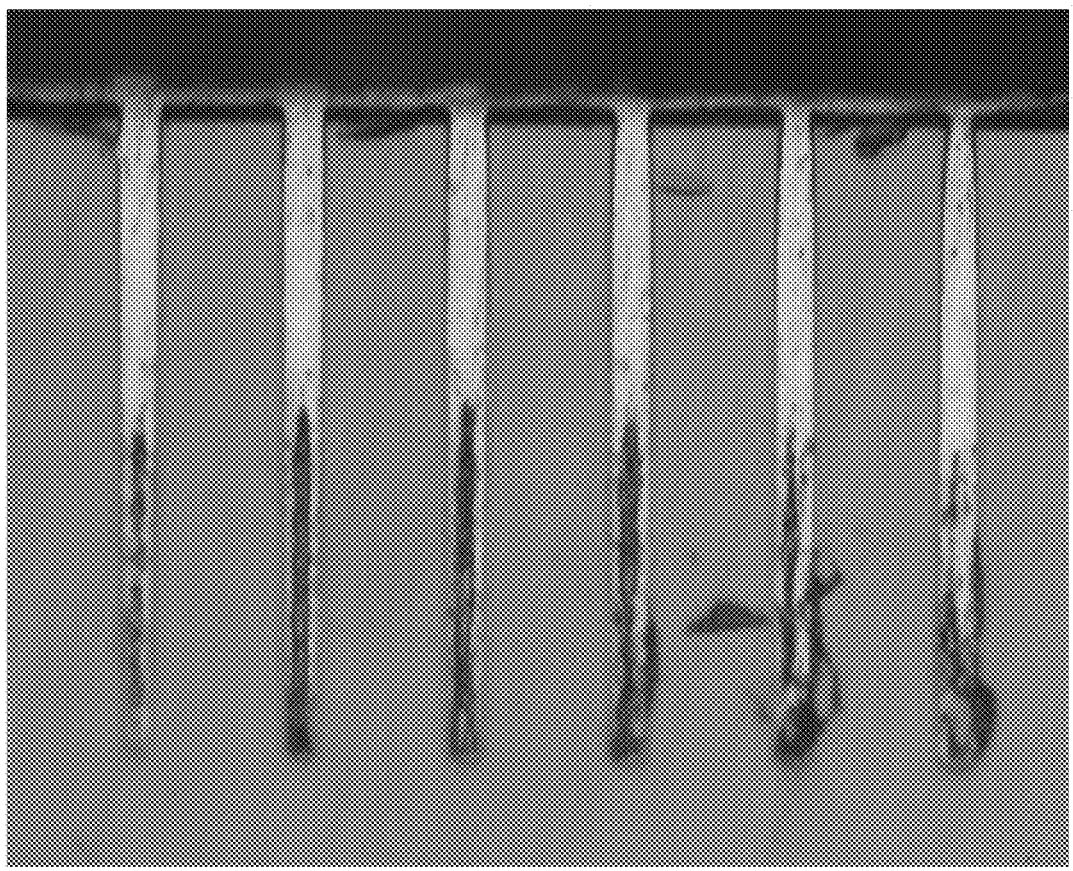
FIG. 2 is an optical micrograph at 60× of a cross-section of copper filled TSVs with voids plated from a copper bath containing a PO/EO primary alkyl alkoxylate diblock copolymer and an EO/PO/EO triblock copolymer with an HLB of 38.6.

Following copper plating to fill the TSVs, the wafer coupons were cross-sectioned and imaged by optical microscopy at 60× magnification. The optical images were evaluated to determine the filling ability of the plating bath. Substantially all of the copper deposits had a bright surface; however, all of the TSVs had voids as shown in FIG. 2.

Example 6 (Comparative)

The method of Example 6 was repeated except that the suppressors included in the copper plating baths were those in Table 10 below.

TABLE 10

| Suppressor No | Suppressor Material | Amount | Trade Name |
|---|---|---|---|
| 1 | R—O—$(PO)_m$—$(EO)_n$—H diblock copolymer Mw = 1037 g/mole | 120 mg/L | ECOSURF ™ EH 14 surfactant |
| 2 | Alkyl capped EO/PO block polymer (EO/PO = 1/1 w/w), Mn = 970 | 100 mg/L | UCON ™ 50-HB-260 surfactant |

The HLB for suppressor 2 was determined to be 9.5. Variables used for calculating the HLB are in the table below:

TABLE 11

| % EO | Mw EO | Mw PO | # EO Groups | # PO Groups | # CH Groups | # Ether Groups | # OH Groups |
|---|---|---|---|---|---|---|---|
| 50 | 456.5 | 456.5 | 10 | 8 | 48 | 18 | 1 |

Figure 3:
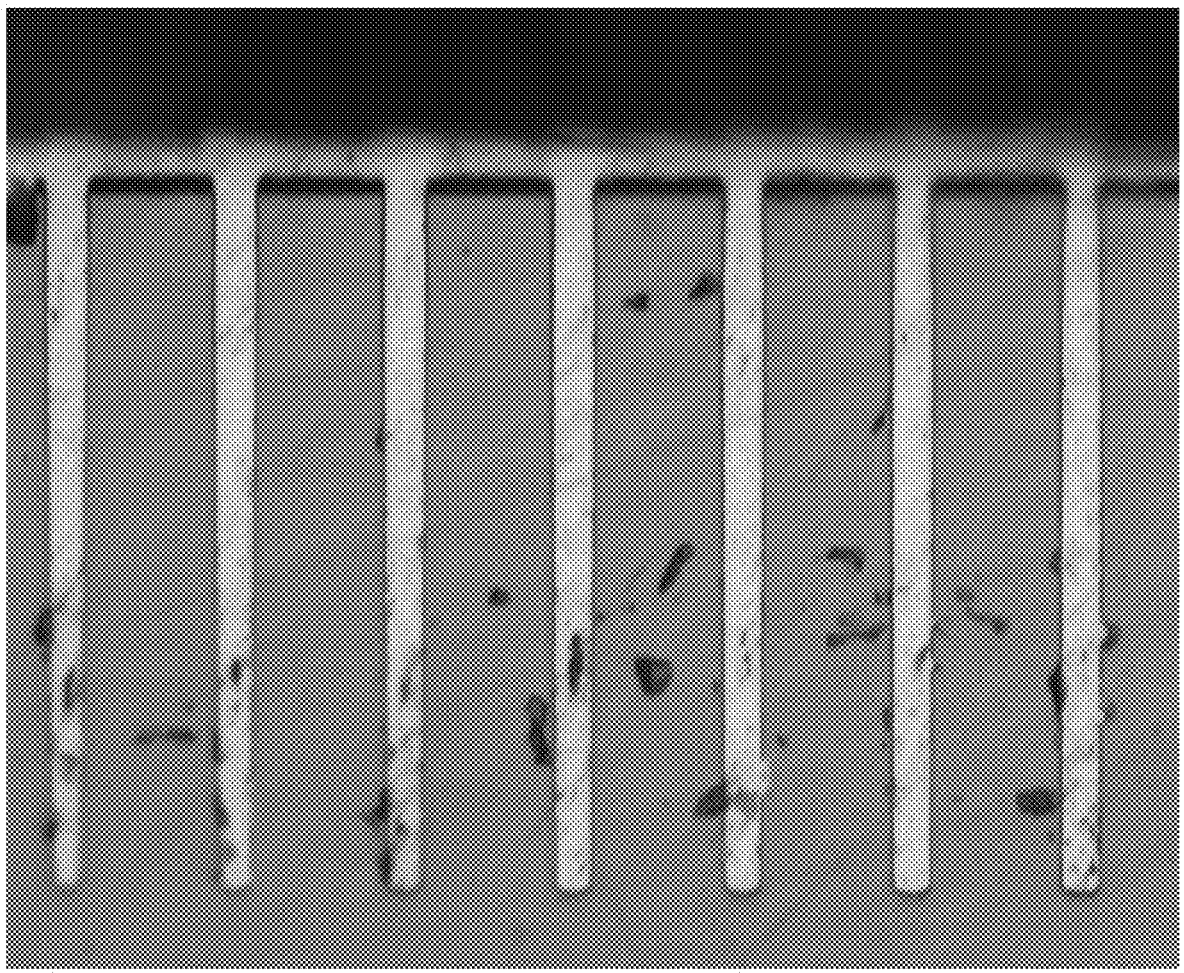
FIG. 3 is an optical micrograph at 60× showing copper filled TSVs with voids plated from a copper bath containing a R—O—(PO)$_m$-(EO)$_n$—H primary alkyl alkoxylate diblock copolymer and alkyl capped EO/PO block copolymer with an HLB of 9.5.

All of the TSVs appeared to have voiding as shown in FIG. 3 and substantially all of the copper deposits had hazy surfaces.

What is claimed is:

1. A method of filling a through-silicon via in an electronic device with copper comprising:

a) providing an acid copper electroplating bath comprising a source of copper ions, an acid electrolyte, a source of halide ions, an accelerator, a leveler, a primary alcohol alkoxylate block copolymer having a formula:

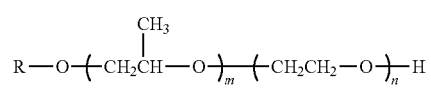

(I)

wherein R is a linear or branched ($C_1$-$C_{15}$) alkyl moiety or a linear or branched ($C_2$-$C_{15}$) alkenyl moiety and m and n can be the same or different and are moles of each moiety wherein the primary alcohol alkoxylate has a weight average molecular weight of 500 g/mole to 20,000 g/mole and a random or block alkoxylate copolymer comprising ethylene oxide and propylene oxide moieties wherein the random or block alkoxylate copolymer has an HLB of 16 to 35 and the copper electroplating bath has a surface tension ≤40 mN/m;

b) providing as a cathode an electronic device substrate having one or more through-silicon vias to be filled with copper and having a conductive surface, wherein the through-silicon via have depths of 5 to 600 μm and diameters of 1 to 200 μm;

c) contacting the electronic device substrate with the copper electroplating bath; and d) applying a potential for a period of time sufficient to fill the through-silicon vias with a copper deposit; wherein the copper deposit in the through-silicon vias is substantially void-free and substantially free of surface defects.

2. The method of claim 1, wherein the alkoxylate copolymer is a triblock copolymer having formula:

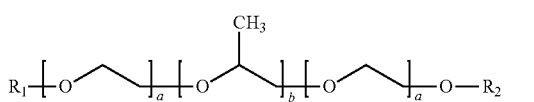

(III)

wherein $R_1$ and $R_2$ are the same or different and are chosen from hydrogen and linear or branched (Ci-Ci5) alkyl and a and b can be the same or different and are moles of each moiety and the HLB of the triblock copolymer is from 16 to 35.

3. The method of claim 2, wherein the triblock copolymer has a formula:

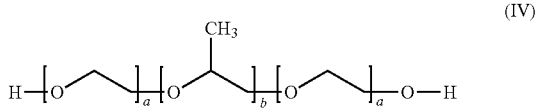

(IV)

wherein a and b can be the same or different and are moles of each moiety and the HLB of the triblock copolymer is from 16 to 35.

4. The method of claim 1, wherein the HLB of the random or block alkoxylate copolymer is 17 to 25.

5. The method of claim 4, wherein the HLB of the random or block alkoxylate copolymer is 18 to 25.

6. The method of claim 1, wherein the conductive surface is a seed layer.

7. The method of claim 6, wherein the seed layer is a copper seed layer.

8. The method of claim 1, wherein the electronic device is a wafer or a die.

9. An acid copper electroplating bath composition comprising: a source of copper ions; an acid electrolyte; a source of halide ions; an accelerator; a leveler; a primary alcohol alkoxylate block copolymer having a formula:

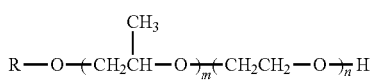

(I)

wherein R is a linear or branched ($C_1$-$C_{15}$) alkyl moiety or a linear or branched ($C_2$-$C_{15}$) alkenyl moiety and m and n may be the same or different and are moles or each moiety, wherein the primary alcohol alkoxylate has a weight average molecular weight of 500 g/mole to 20,000 g/mole and a random or block alkoxylate copolymer comprising ethylene oxide and propylene oxide moieties wherein the random or block alkoxylate copolymer has an HLB of 16 to 35 and the copper electroplating bath has a surface tension ≤40 mN/m.

10. The acid copper electroplating bath composition of claim 9, wherein the alkoxylate copolymer is a triblock copolymer having formula:

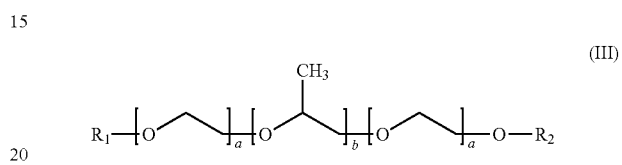

(III)

wherein $R_1$ and $R_2$ are the same or different and are chosen from hydrogen and linear or branched ($C_1$-$C_{15}$)alkyl and a and b can be the same or different and are moles of each moiety and the HLB of the triblock copolymer is from 16 to 35.

11. The acid copper electroplating bath composition of claim 10, wherein the triblock copolymer has a formula:

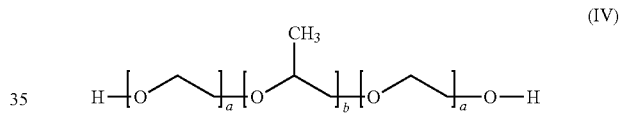

(IV)

wherein a and b can be the same or different and are moles of each moiety and the HLB of the triblock copolymer is from 16 to 35.

12. The acid copper electroplating bath composition of claim 9, wherein the HLB of the random or block alkoxylate copolymer is 17 to 25.

* * * * *